US010142762B1

(12) United States Patent
Prasad et al.

(10) Patent No.: US 10,142,762 B1
(45) Date of Patent: Nov. 27, 2018

(54) INTELLIGENT DYNAMIC SOUNDSCAPE ADAPTATION

(71) Applicant: Plantronics, Inc., Santa Cruz, CA (US)

(72) Inventors: Vijendra G. R. Prasad, Cupertino, CA (US); Philip Sherburne, Morgan Hill, CA (US); Evan Harris Benway, Santa Cruz, CA (US); Erick Castillo, Santa Cruz, CA (US)

(73) Assignee: Plantronics, Inc., Santa Cruz, CA (US)

( * ) Notice: Subject to any disclaimer, the term of this patent is extended or adjusted under 35 U.S.C. 154(b) by 0 days.

(21) Appl. No.: 15/615,733

(22) Filed: Jun. 6, 2017

(51) Int. Cl.

| | |
|---|---|
| ***H03B 29/00*** | (2006.01) |
| ***H04S 7/00*** | (2006.01) |
| ***G10L 19/012*** | (2013.01) |
| ***G10L 19/26*** | (2013.01) |
| ***G10L 21/0216*** | (2013.01) |

(52) U.S. Cl.
CPC ............ *H04S 7/305* (2013.01); *G10L 19/012* (2013.01); *G10L 19/26* (2013.01); *G10L 21/0216* (2013.01)

(58) Field of Classification Search
CPC ....... H04S 7/305; G10L 19/012; G10L 19/26; G10L 21/0216
USPC ................................................ 381/73.1, 71.8
See application file for complete search history.

(56) References Cited

U.S. PATENT DOCUMENTS 8,761,411 B2 6/2014 Zickmantel
2009/0175484 A1 7/2009 Saint Vincent et al.
2011/0188666 A1 8/2011 Mason et al.
2012/0316869 A1 12/2012 Pei et al.
2013/0259254 A1* 10/2013 Xiang ................. G10K 11/175 381/73.1
2015/0243297 A1* 8/2015 Benway ............... H05K 999/99 704/226
2015/0287421 A1 10/2015 Benway et al.

FOREIGN PATENT DOCUMENTS

WO WO-2015/126630 A1 8/2015

OTHER PUBLICATIONS

Wikipedia Speech Transmission Index (https://en.wikipedia.org/wiki/Speech_transmission_index).*
International Search Report and Written Opinion dated Aug. 21, 2018 in International Patent Application No. PCT/US2018/036215, filed Jun. 6, 2018 (13 pages).

* cited by examiner

*Primary Examiner* — Paul S Kim
*Assistant Examiner* — Ammar Hamid
(74) *Attorney, Agent, or Firm* — Chuang Intellectual Property Law

(57) ABSTRACT

Methods and apparatuses for addressing open space noise are disclosed. In one example, a method for masking open space noise includes receiving a microphone output signal from a microphone, the microphone one of a plurality of microphones in an open space. The method includes detecting a presence of a noise source from the microphone output signal, and determining whether the noise source is capable of being masked with a noise masking sound. The method further includes increasing a volume of a noise masking sound output from a loudspeaker responsive to a determination that the noise source is capable of being masked, the loudspeaker located in a same geographic sub-unit of the open space as the microphone. The loudspeaker is one of a plurality of loudspeakers in the open space.

23 Claims, 11 Drawing Sheets

INTELLIGENT DYNAMIC SOUNDSCAPE ADAPTATION

BACKGROUND OF THE INVENTION

Noise within an open space is problematic for people working within the open space. Open space noise is typically described by workers as unpleasant and uncomfortable. Speech noise, printer noise, telephone ringer noise, and other distracting sounds increase discomfort. This discomfort can be measured using subjective questionnaires as well as objective measures, such as cortisol levels.

For example, many office buildings utilize a large open office area in which many employees work in cubicles with low cubicle walls or at workstations without any acoustical barriers. Open space noise, and in particular speech noise, is the top complaint of office workers about their offices. One reason for this is that speech enters readily into the brain's working memory and is therefore highly distracting. Even speech at very low levels can be highly distracting when ambient noise levels are low (as in the case of someone having a conversation in a library). Productivity losses due to speech noise have been shown in peer-reviewed laboratory studies to be as high as 41%.

Another major issue with open offices relates to speech privacy. Workers in open offices often feel that their telephone calls or in-person conversations can be overheard. Speech privacy correlates directly to intelligibility. Lack of speech privacy creates measurable increases in stress and dissatisfaction among workers.

In the prior art, noise-absorbing ceiling tiles, carpeting, screens, and furniture have been used to decrease office noise levels. Reducing the noise levels does not, however, directly solve the problems associated with the intelligibility of speech. Speech intelligibility can be unaffected, or even increased, by these noise reduction measures. As office densification accelerates, problems caused by open space noise become accentuated.

As a result, improved methods and apparatuses for addressing open space noise are needed.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Figure 1:
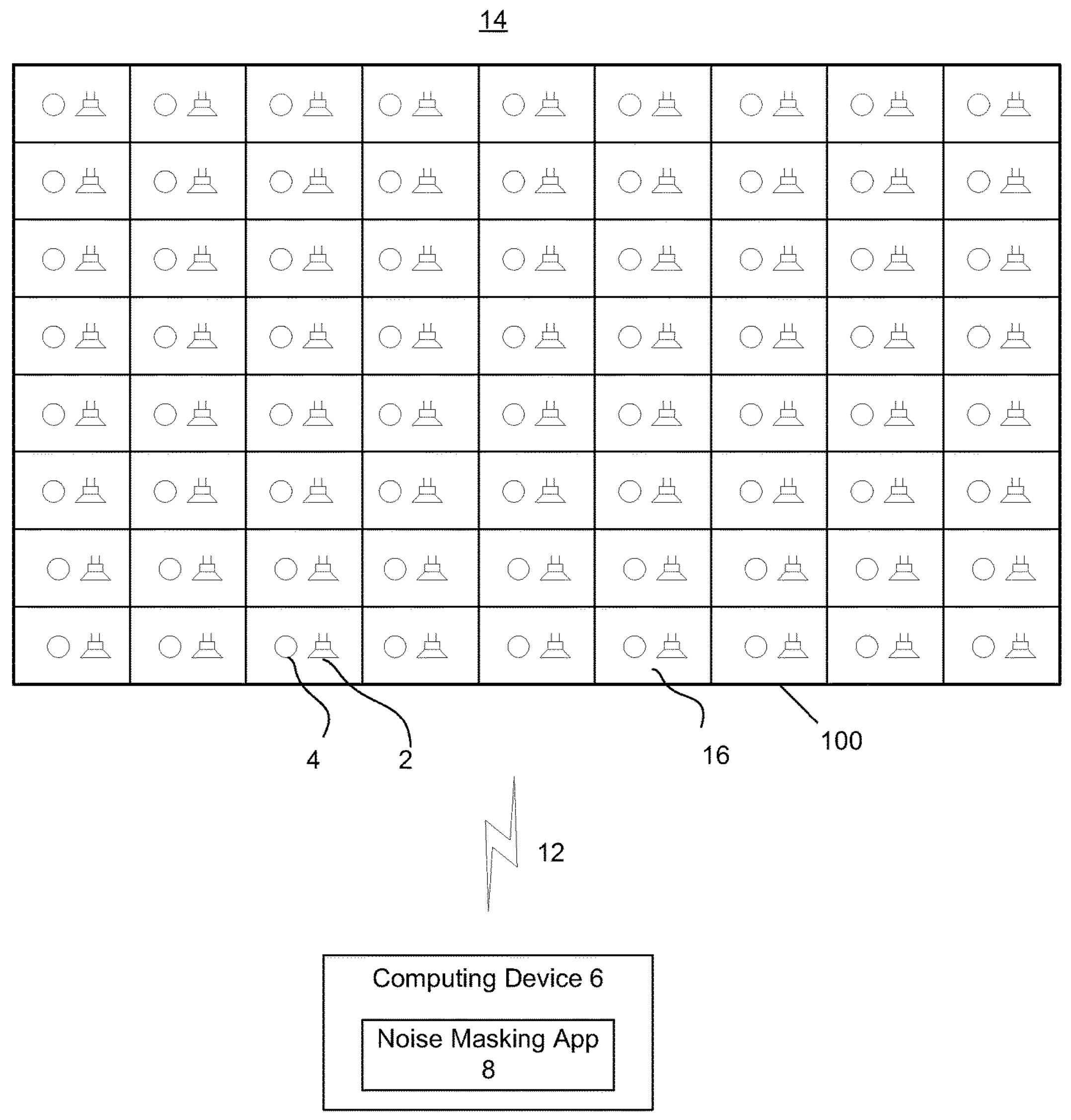
FIG. 1 illustrates a system for masking open space noise in one example.

Methods and apparatuses for masking open space noise are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein.

Block diagrams of example systems are illustrated and described for purposes of explanation. The functionality that is described as being performed by a single system component may be performed by multiple components. Similarly, a single component may be configured to perform functionality that is described as being performed by multiple components. For purpose of clarity, details relating to technical material that is known in the technical fields related to the invention have not been described in detail so as not to unnecessarily obscure the present invention. It is to be understood that various examples of the invention, although different, are not necessarily mutually exclusive. Thus, a particular feature, characteristic, or structure described in one example embodiment may be included within other embodiments.

"Sound masking" is the introduction of constant background noise in a space in order to reduce speech intelligibility, increase speech privacy, and increase acoustical comfort. For example, a pink noise, filtered pink noise, brown noise, or other similar noise (herein referred to simply as "pink noise") may be injected into the open office. Pink noise is effective in reducing speech intelligibility, increasing speech privacy, and increasing acoustical comfort.

The inventors have recognized one problem in designing an optimal sound masking system is setting the proper masking levels and spectra. In certain systems, sound masking levels and spectra are set during installation. The levels and spectra are set equally on all loudspeakers. The problem with this is that office noise levels fluctuate over time and by location, and different masking levels and spectra may be required for different areas. An acoustical consultant installing a sound masking system outside of normal business hours is unlikely to properly address this problem and the masking levels and spectra may therefore be sub-optimal.

In one example of the invention, a method for controlling output of noise masking sound in an open space includes receiving a microphone output signal from a microphone, the microphone one of a plurality of microphones in an open space. The method includes detecting a presence of a noise source from the microphone output signal, and determining whether the noise source is capable of being masked with a noise masking sound. The method further includes increasing a volume of a noise masking sound output from a loudspeaker responsive to a determination that the noise source is capable of being masked, the loudspeaker located in a same geographic sub-unit of the open space as the microphone. The loudspeaker is one of a plurality of loudspeakers in the open space.

In one example of the invention, a system includes a plurality of microphones to be disposed in an open space, a plurality of loudspeakers to be disposed in the open space, and a computing device. The computing device includes a communications interface configured to receive a plurality of microphone output signals from the plurality of microphones and configured to transmit noise masking signals for output at the plurality of loudspeakers. The computing device further includes a processor, and a memory storing an application program comprising instructions executable by the processor to perform operations. The operations include receiving a microphone output signal from a microphone, the microphone one of the plurality of microphones, and detecting a presence of a noise source from the microphone output signal. The operations further include determining whether the noise source is capable of being masked with a noise masking sound. The operations further include increasing an output level of a noise masking signal at a loudspeaker responsive to a determination that the noise source is capable of being masked, the loudspeaker located in a same geographic sub-unit of the open space as the microphone. The loudspeaker is one of the plurality of loudspeakers.

In one example of the invention, a method includes providing a plurality of loudspeakers in an open space and detecting a noise source in the open space utilizing one or more microphones in the open space. The method includes determining a first region, a second region, and a third region within the open space responsive to detecting the noise source, wherein the noise source is located in the first region, the second region is outside of and adjacent to the first region, and the third region is outside of and adjacent to the second region. The method includes identifying a subset of the plurality of loudspeakers located in the second region. The method further includes adjusting a first output level of a first noise masking signal from a first loudspeaker of the subset of the plurality of loudspeakers located in the second region and adjusting a second output level of a second noise masking signal from a second loudspeaker of the subset of the plurality of loudspeakers located in the second region, the first output level different from the second output level. The method further includes maintaining a third output level of a third noise masking signal from a third loudspeaker of the plurality of loudspeakers located in the third region.

In one example of the invention, a method includes receiving a microphone output signal from each of a plurality of microphones arranged within an open space, each microphone in proximity to a corresponding loudspeaker arranged to output a noise masking sound into the open space. The method includes detecting a first level of an undesirable noise source from a first microphone output signal from a first microphone, a second level of the undesirable noise source from a second microphone output signal from a second microphone, and a third level of the undesirable noise source from a third microphone output signal from a third microphone. The method further includes reducing or maintaining a first noise masking sound output at a first corresponding loudspeaker responsive to detecting the first level, increasing a second noise masking sound output at a second corresponding loudspeaker responsive to detecting the second level, and increasing a third noise masking sound output at a third corresponding loudspeaker responsive to detecting the third level.

In one example of the invention, a noise masking system divides an open space into regions. The sound masking system does not adjust the output of noise masking sound solely based on the measured distraction (i.e., a noise source) in a particular region. Rather, the noise masking system forms a masking region (an area whereby the output of noise masking sound from loudspeakers is increased) around the noise source (e.g., a person talking) to protect others in the open space. Specifically, the noise masking sound output is not increased where the person talking is, but around the person. Advantageously, this solution avoids what is known as the "Lombard Effect" whereby the person talking would increase the volume of his speech in response to hearing an increase in noise masking sound.

In one form of this solution, the masking region would be in the form of a circular ring around the distracting talker(s). It is a ring and not a circle, since the solution is to not increase the masking sound level above the talker(s) and in their immediate vicinity. The ambient noise level, distracting noise level, and free space sound propagation characteristics determine the dimensions of this ring.

Since multiple sensors in the space may detect the same distraction and there may be multiple distractions at the same time, a set of masking regions may be established to optimally adjust the soundscape depending on the distraction levels detected by the various sensors. Depending on the proximity of detected distractions, these masking regions and the areas enclosed by the masking regions may or may not overlap. In a more sophisticated form of this solution, the masking region would an irregularly contoured ring. The irregular contour will result from the actual modeling of the sound propagation characteristics of the space and not based on theoretical free space propagation model. This will account for the unique absorption and reflection characteristics of the space.

To create the ring shaped masking region, the system controls each loudspeaker in an installation. The system utilizes a grid of noise sensors (e.g., microphones) and loudspeakers. The sensor grid is positioned so that it is capable of detecting and locating the position of a distraction within the open space. In one example, the sensor grid is installed on a wider grid than loudspeakers. Using knowledge of the loudspeaker and open space (e.g., room) layout, the noise masking system may control individual loudspeakers to create an irregular sound masking region.

Advantageously, the noise masking system does not unnecessarily increase noise masking levels at locations within the open space far from the noise source where the noise source is not distracting. Simultaneously, the noise masking system does not unnecessarily increase noise masking levels at locations immediately proximate the noise source itself, thereby preventing a negative feedback loop in which the volume of the noise masking sound is increased, the distractor increases the volume of his voice in response to the increase, the noise masking sound is increased again in response to detecting the higher voice volume, etc.

Figure 2:
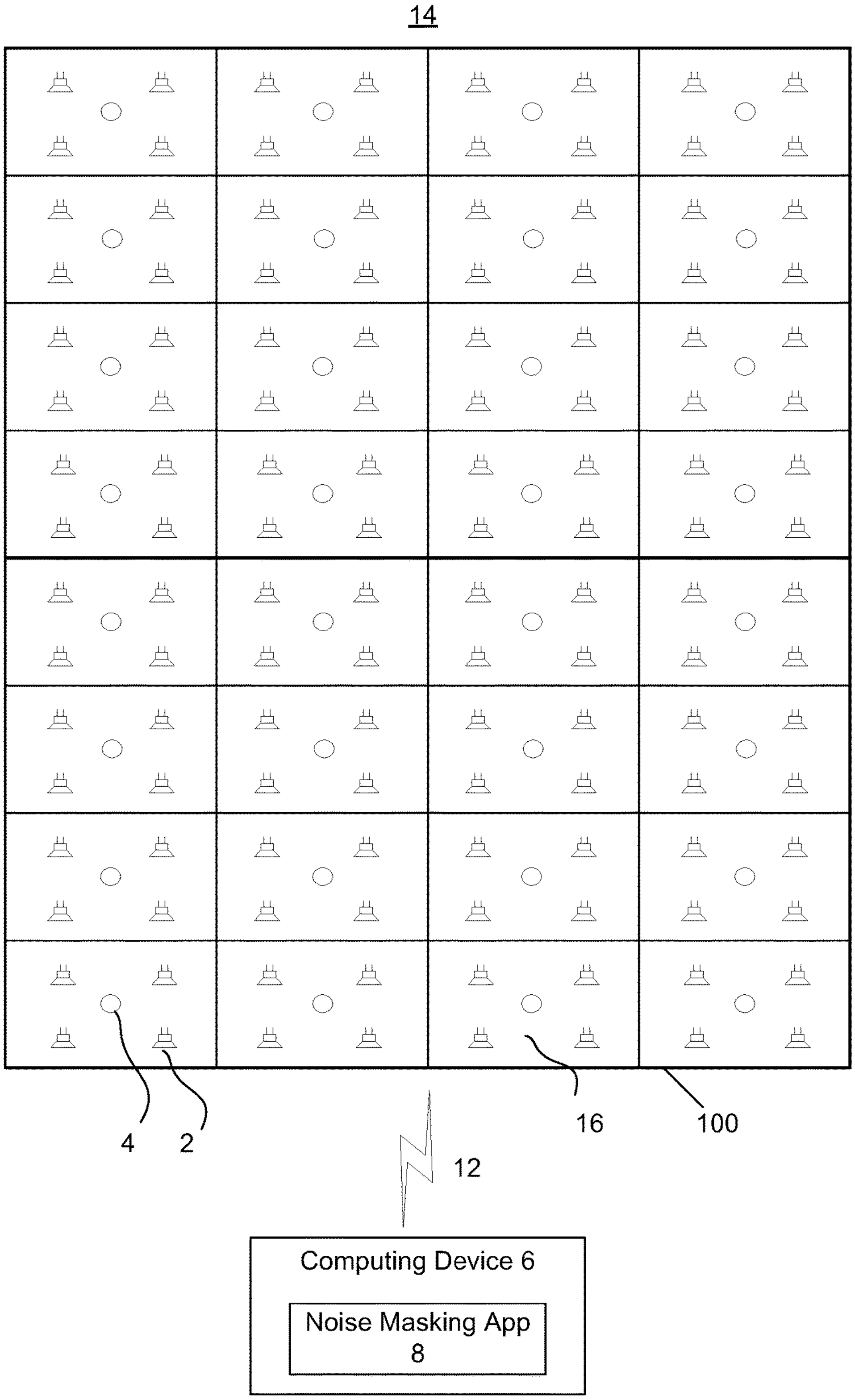
FIG. 2 illustrates a system for masking open space noise in a further example.

FIG. 1 illustrates a noise masking system 14 for masking open space noise in one example. Placement of a plurality of loudspeakers 2 and microphones 4 in an open space 100 in one example is shown. For example, open space 100 may be a large room of an office building in which employee workstations such as cubicles are placed. Illustrated in FIG. 1, there is one loudspeaker 2 for each microphone located in a same geographic sub-unit 16. FIG. 2 illustrates a system for masking open space noise in a further example, where there are four loudspeakers 2 for each microphone 4 located in a same geographic sub-unit 16. In further examples, the ratio of loudspeakers 2 to microphones 4 may be varied.

Sound masking systems may be: (1) in-plenum and (2) direct field. In-plenum systems involve loudspeakers installed above the ceiling tiles and below the ceiling deck.

The loudspeakers are generally oriented upwards, so that the masking sound reflects off of the ceiling deck, becoming diffuse. This makes it more difficult for workers to identify the source of the masking sound and thereby makes the sound less noticeable. In one example, each loudspeaker 2 is one of a plurality of loudspeakers which are disposed in a plenum above the open space and arranged to direct the loudspeaker sound in a direction opposite the open space. Microphones 4 are arranged in the ceiling to detect sound in the open space. In a further example, a "Direct field" system is used, whereby the masking sound travels directly from the loudspeakers to a listener without interacting with any reflecting or transmitting feature.

In a further example, loudspeakers 2 and microphones 4 are disposed in workstation furniture located within open space 100. In one example, the loudspeakers 2 may be advantageously disposed in cubicle wall panels so that they are unobtrusive. The loudspeakers may be planar (i.e., flat panel) loudspeakers in this example to output a highly diffuse noise masking sound. Microphones 4 may be also be disposed in the cubicle wall panels, or located on head-worn devices such as telecommunications headsets within the area of each workstation. In further examples, microphones 4 and loudspeakers 2 may also be located on personal computers, smartphones, or tablet computers located within the area of each workstation.

Figure 10:
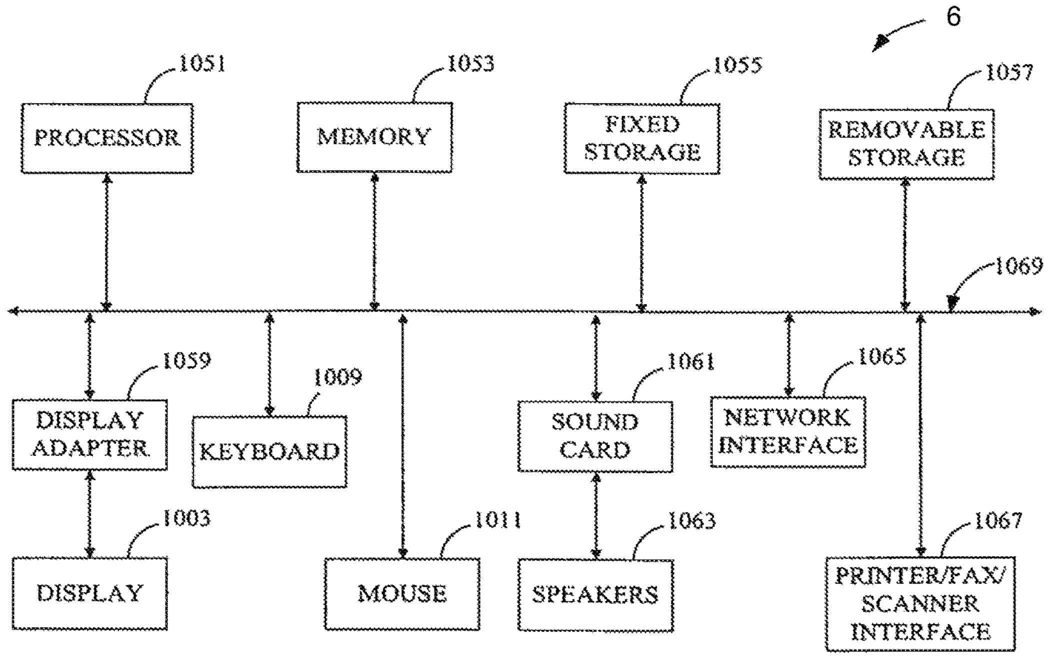
FIG. 10 illustrates a system block diagram of a computing device suitable for executing software application programs that implement the methods and processes described herein in one example.

The system 14 includes a computing device 6 including a processor and a memory storing application programs comprising instructions executable by the processor to perform operations as described herein to receive and process microphone signals and output noise masking signals. FIG. 10 illustrates a system block diagram of a computing device 6 in one example.

Computing device 6 includes a noise masking application 8 interfacing with each microphone 4 to receive microphone output signals and/or noise level measurements. Microphone output signals may be processed at each microphone 4, at computing device 6, or at both. Each microphone 4 transmits data to computing device 6. In one example, the noise masking application 8 is configured to receive noise level measurements from one or more microphones and adjust a sound masking volume level output from one or more loudspeakers 2. In one example, the noise masking application 8 is configured to receive a location data associated with each microphone 4 and loudspeaker 2.

In one example, noise masking application 8 stores microphone data in a data structure such as a table. Microphone data may include unique identifiers for each microphone, measured noise levels, and microphone location. In one example, each microphone location within open space 100 is recorded during an installation process of the noise masking system 14. For each microphone, the measured noise level is recorded for use by noise level management application 18 as described herein.

Computing device 6 is capable of electronic communications with each loudspeaker 2 and microphone 4 via either a wired or wireless communications link 12. For example, computing device 6, loudspeakers 2, and microphones 4 are connected via one or more communications networks such as a local area network (LAN) or an Internet Protocol network. In a further example, a separate computing device may be provided for each loudspeaker 2 and microphone 4 pair.

Noise masking system 14 includes a plurality of loudspeakers 2 under control of a computing device 6. In one example, computing device 6 is a server. In a further example, computing device 6 interfaces with a server to receive control signals. In one example, each loudspeaker 2 and microphone 4 is network addressable and has a unique Internet Protocol address for individual control. Loudspeaker 2 and microphone 4 may include a processor operably coupled to a network interface, output transducer, memory, amplifier, and power source. Loudspeaker 2 and microphones 4 also include a wireless interface utilized to link with a control device such as computing device 6. In one example, the wireless interface is a Bluetooth or IEEE 802.11 transceiver. The processor allows for processing data, including receiving microphone signals and managing noise masking signals over the network interface, and may include a variety of processors (e.g., digital signal processors), with conventional CPUs being applicable.

In the system illustrated in FIG. 1, sound is output from loudspeakers 2 corresponding to a noise masking signal configured to mask open space noise. In one example, the noise masking signal is a random noise such as pink noise, filtered pink noise, brown noise, or other similar noise (herein referred to simply as "pink noise"). Pink noise is effective in reducing speech intelligibility, increasing speech privacy, and increasing acoustical comfort. The sound operates to mask open space noise heard by a person in open space 100. In one example, the masking levels are advantageously dynamically adjusted in response to the noise level measurements received at one or more microphones 4. In one example, masking levels are adjusted on a loudspeaker-by-loudspeaker basis in order to address location-specific noise levels.

Utilizing the system shown in FIG. 1, the differences in the noise transmission quality at particular areas within open space 100 are taken into consideration when determining output levels of the noise masking signals. For example, utilizing the noise measurements at a microphone 4 at a first area and the noise measurements at a microphone 4 at a second area, the output level of a first noise masking signal from the loudspeaker 2 proximate the first area may be different from the output level of a second noise masking signal from the loudspeaker 2 proximate the second area.

In one example operation, noise masking application 8 receives a microphone output signal from a microphone 4 and detects a presence of a noise source from the microphone output signal. Where the noise source is undesirable user speech, a voice activity is detected. For example, a voice activity detector (VAD) may be utilized in processing the microphone output signal.

Noise masking application 8 determines whether the noise source is capable of being masked with a noise masking sound. One or more techniques may be utilized to determine whether the noise source is capable of being masked. In one example, a signal-to-noise ratio from the microphone output signal is identified. In a further example, a loudness level of the noise source is determined.

Noise masking application 8 increases an output level of a noise masking signal at a loudspeaker 2 responsive to a determination that the noise source is capable of being masked, the loudspeaker 2 located in a same geographic sub-unit 16 of the open space 100 as the microphone 4. In one example, the volume of the noise masking sound output from the loudspeaker 2 is increased an amount responsive to a detected level of the noise source.

If noise masking application 8 determines the noise source is not capable of being masked, noise masking application 8 decreases or maintains the volume of the noise masking sound output from the loudspeaker 2 located in a same geographic sub-unit 16 responsive to a determination that the noise source is not capable of being masked. Noise masking application 8 decreases the volume of the noise masking sound output from the loudspeaker 2 responsive to detecting a reduction or a termination of the noise source from the microphone output signal.

In one example, the above process is repeated at each geographic sub-unit 16. For example, noise masking application 8 receives a second microphone output signal from a second microphone 4 and detects the presence of the noise source (e.g., the same noise source as detected by the first microphone 4), and determines whether the noise source is capable of being masked with a second noise masking sound. Noise masking application 8 increases the output level of a second noise masking signal at a second loudspeaker 2 responsive to a determination that the noise source is capable of being masked, the second loudspeaker 2 located in a same geographic sub-unit of an open space as the second microphone 4. Because the second microphone 4 is at a different location within open space 100 from the first microphone 4, the detected characteristic of noise source will be different depending on whether the second microphone 4 is closer or farther from the noise source as the first microphone 4. For this reason, the second noise masking signal may be output a different level than the first noise masking signal.

Figure 9A:
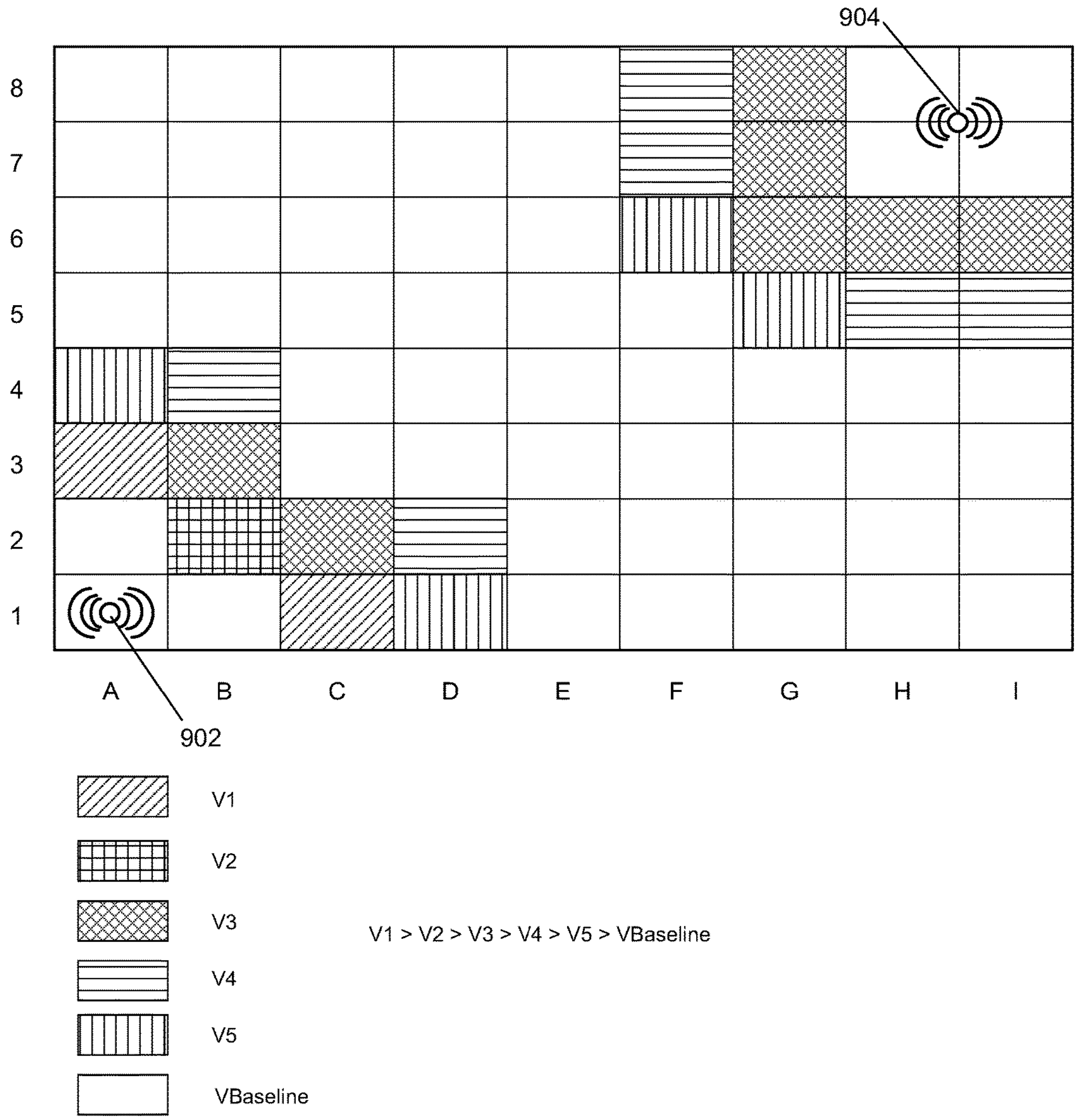
FIG. 9A illustrates output of noise masking sound in an open space in a further example.

FIG. 9A illustrates output of noise masking sound in an open space in an example operation of system 14. Illustrated in FIG. 9A is a "heat map" of the volume level (V) of the output of noise masking sounds in an open space 100 in response to a noise source 902 and a noise source 904. In this example, $V1>V2>V3>V4>V5>V_{Baseline}$. $V_{Baseline}$ is the volume level of the noise masking sound output prior to detection of noise source 902 and 904. In one example, the volume levels of $V_{Baseline}$ to V1 range from approximately 45 dBSPL (A-weighted) to 52 dBSPL (A-weighted).

In response to noise source 902, noise masking sound is output at a volume level $V_{Baseline}$ at locations A1, A2, and B1 immediately adjacent noise source 902. In this example, noise masking application 8 has determined that the noise source 902 cannot be masked at locations A1, A2, and B1.

Noise masking sound is output at a volume level V1 at locations A3 and C1. Noise masking sound is output at a volume level V2 at location B2. Noise masking sound is output at a volume level V3 at location B3 and C2. Noise masking sound is output at a volume level V4 at location B4 and D2. Noise masking sound is output at a volume level V5 at location A4 and D1. In this example, noise masking application 8 has determined that the noise source 902 has been detected and can be masked at locations A3-A4, B2-B4, C1-C2, and D1-D2. Furthermore, noise masking application 8 has adjusted the volume level output at each location based on the detected sound level of the noise source. As such, a gradient is created where the volume level of the noise masking sound is decreased as the distance from noise source 902 increases. Furthermore, noise masking application 8 accounts for specific noise transmission characteristics within open space 100. For example, at location B2 the transmission of noise source 902 is reduced relative to locations A3 and C1 even though B2 is at closer distance. The variation may result from physical structures within open space 100. As a result of the reduced transmission, noise masking sound is output at volume level V2 at location B2 rather than volume level V1 output at locations A3 and C1.

Finally, at locations far from noise source 902, such as locations A5, B5, etc., noise masking application 8 does not adjust the output level of the noise masking sound from $V_{Baseline}$. In this example, noise masking application 8 has determined that the noise source 902 was not detected (or detected to be below a minimum threshold level) at these locations. Advantageously, people in these locations are not unnecessarily subjected to increased noise masking sound levels.

In response to noise source 904, noise masking application 8 adjusts sound masking levels in a similar manner. Proximate noise source 904, noise masking sound is output at a volume level $V_{Baseline}$ at locations H7, H8, I7, and I8. Far from noise source 904, noise masking sound is output at a volume level $V_{Baseline}$ at locations E8, E7, etc. Noise masking application 8 creates a noise masking region in which noise masking levels are increased: Noise masking sound is output at a volume level V3 at locations G6, G7, G8, H6, and I6. Noise masking sound is output at a volume level V4 at F7, F8, H5, and I5. Noise masking sound is output at volume level V5 at F6 and G5.

Figure 9B:
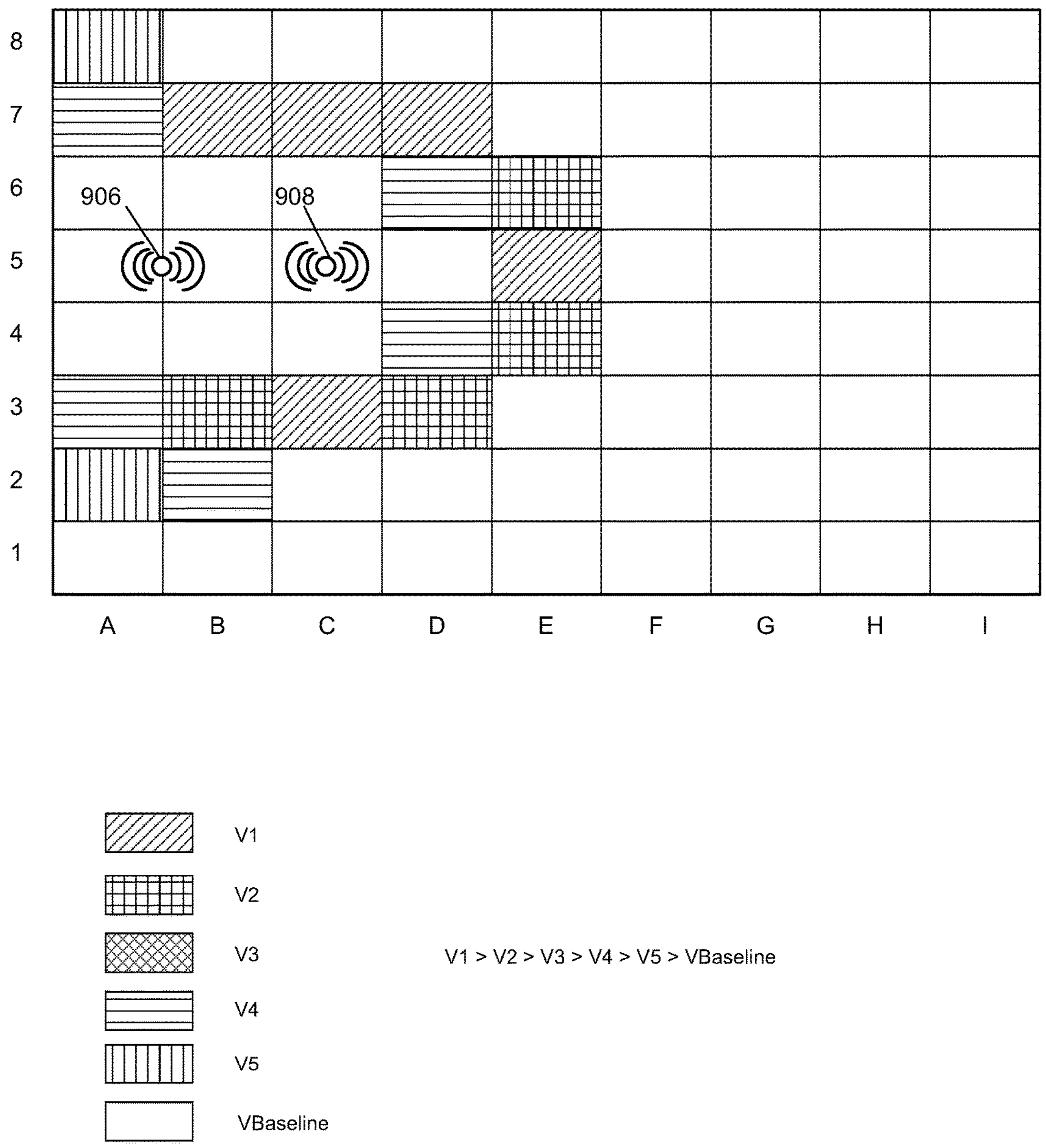
FIG. 9B illustrates output of noise masking sound in an open space in a further example.

FIG. 9B illustrates output of noise masking sound in an open space in a further example. Illustrated in FIG. 9B is a "heat map" of the volume level of the output of noise masking sounds in an open space 100 in response to a noise source 906 and a noise source 908. In response to noise sources 906 and 908, noise masking application 8 adjusts sound masking levels in a similar manner to that described above with respect to FIG. 9A.

Proximate to noise sources 906 and 908, noise masking sound is output at a volume level $V_{Baseline}$ at locations A4, A5, A6, B4, B5, B6, C4, C5, C6, and D5. Due to the increased noise level resulting from both noise source 906 and 908, noise masking application 8 maintains volume level $V_{Baseline}$ at a larger region than for a single noise source. Far from noise sources 906 and 908, noise masking sound is output at a volume level $V_{Baseline}$ at locations A1, B8, etc.

In between, noise masking application 8 creates a noise masking region in which noise masking levels are increased. Noise masking sound is output at a volume level V1 at locations B7, B8, B9, E5, and C3. Noise masking sound is output at a volume level V2 at locations E4, E6, D3, and B3. Noise masking sound is output at a volume level V4 at locations A3, A7, B2, D4, and D6. Noise masking sound is output at a volume level V5 at locations A2 and A8.

In a further example operation, noise masking application 8 receives a microphone output signal from each of a plurality of microphones 4 arranged within an open space 100, each microphone 4 in proximity to a corresponding loudspeaker 2 arranged to output a noise masking sound into the open space 100. Noise masking application 8 detects a first level of an undesirable noise source from a first microphone output signal from a first microphone 4, detects a second level of the undesirable noise source from a second microphone output signal from a second microphone 4, detects and a third level of the undesirable noise source from a third microphone output signal from a third microphone 4.

Noise masking application 8 reduces or maintains a first noise masking sound output at a first corresponding loudspeaker 2 responsive to detecting the first level, increases a second noise masking sound output at a second corresponding loudspeaker 2 responsive to detecting the second level, and increases a third noise masking sound output at a third corresponding loudspeaker 2 responsive to detecting the third level. In one example, the third microphone is located at a distance further from a location of the noise source than a location of the second microphone 4, and the third noise masking sound output is less than the second noise masking sound output.

In one example, noise masking application 8 further detects the undesirable noise source is below a threshold level from a fourth microphone output signal from a fourth microphone 4. Noise masking application 8 maintains a fourth noise masking sound output at a fourth corresponding loudspeaker 2 responsive detecting the undesirable noise source is below the threshold level.

Figure 8:
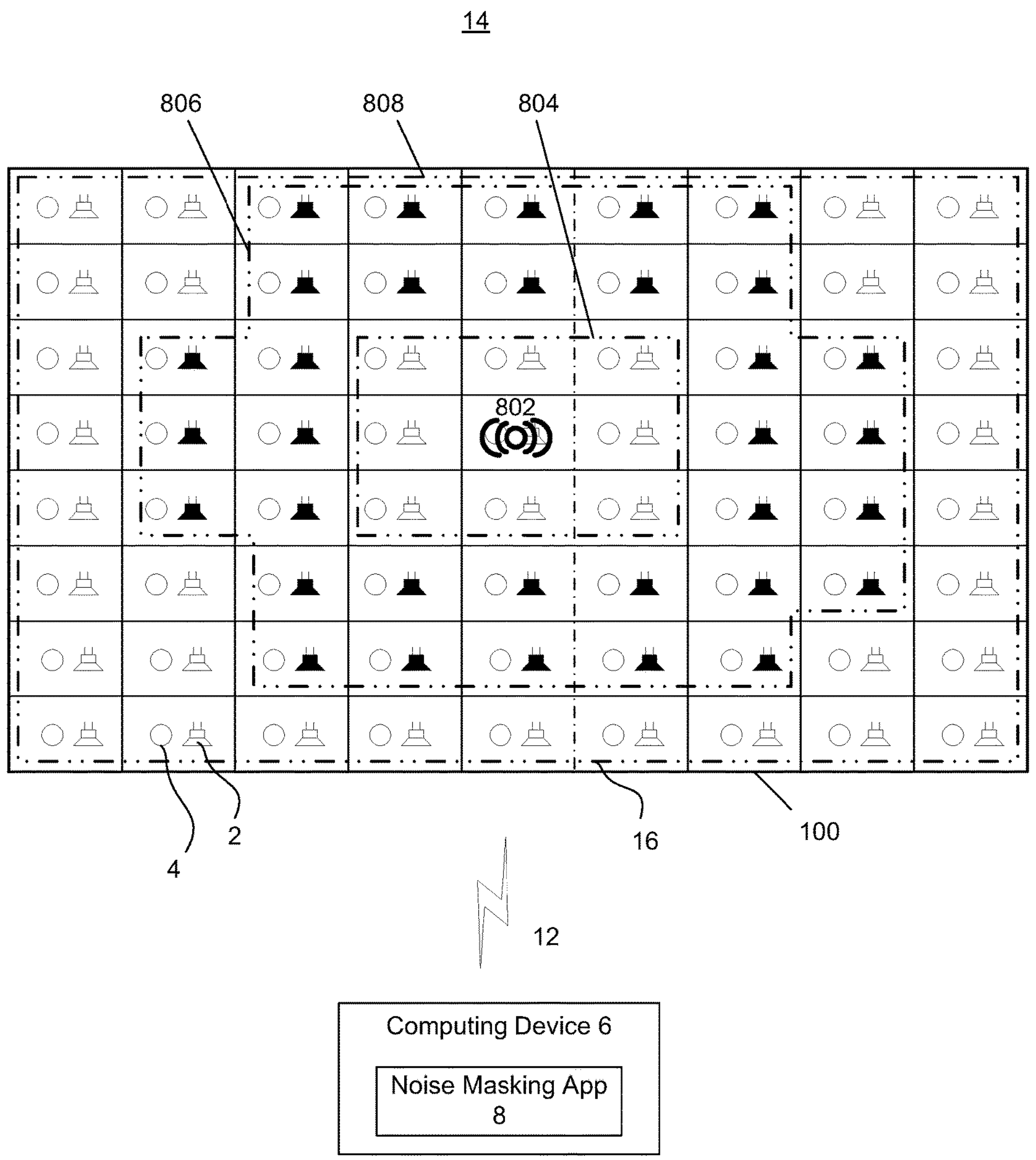
FIG. 8 illustrates output of noise masking sound in an open space in one example.

FIG. 8 illustrates output of noise masking sound in an open space 100 in a further example. In a further example operation, noise masking application 8 detects a noise source 802 in the open space 100 utilizing one or more microphones 4 in the open space 100. Where the noise source 802 is undesirable user speech, a voice activity is detected. For example, a voice activity detector (VAD) may be utilized in processing the microphone output signal.

Noise masking application 8 determines a first region 804, a second region 806, and a third region 808 within the open space 100 responsive to detecting the noise source 802, wherein the noise source 802 is located in the first region 804, the second region 806 is outside of and adjacent to the first region 804, and the third region 808 is outside of and adjacent to the second region 806.

In the first region 804, noise masking application 8 maintains or reduces an output level of the noise masking signal from loudspeakers 2 located in the first region 804. In one example, noise masking application 8 determines the first region 804 by identifying that the noise source 802 is at a level high enough that it cannot be masked by a noise masking signal. In a further example, noise masking application 8 determines the first region 804 by identifying a pre-determined radius from the location of the noise source 802.

Noise masking application 8 identifies loudspeakers 2 located in the second region 806. In one example, noise masking application 8 determines the second region 806 by determining whether the noise source 802 is capable of being masked with a noise masking sound. Specifically, in the second region 806, the noise source 802 is capable of being masked. One or more techniques may be utilized to determine whether the noise source 802 is capable of being masked. In one example, a signal-to-noise ratio from the microphone output signal is identified. In a further example, a loudness level of the noise source 802 is determined.

In one example, noise masking application 8 increases the output level of all loudspeakers located in the second region 806 a same amount responsive to the detected level of noise source 802. In a further example, noise masking application 8 adjusts a first output level of a first noise masking signal from a first loudspeaker 2 of the subset of the plurality of loudspeakers 2 located in the second region 806, and adjusts a second output level of a second noise masking signal from a second loudspeaker 2 of the subset of the plurality of loudspeakers 2 located in the second region 806. The first output level may be different from the second output level.

In the third region 808, noise masking application 8 maintains an output level of the noise masking signal from the loudspeakers 2 located in the third region 808. In one example, noise masking application 8 determines the third region 808 by identifying that the noise source 802 is below a detected volume level at locations within the third region 808 and a response to the noise source 802 is therefore not required.

In various embodiments, the techniques of FIG. 3-7 discussed below may be implemented as sequences of instructions executed by one or more electronic systems. The instructions may be stored by the computing device 6.

Figure 3:
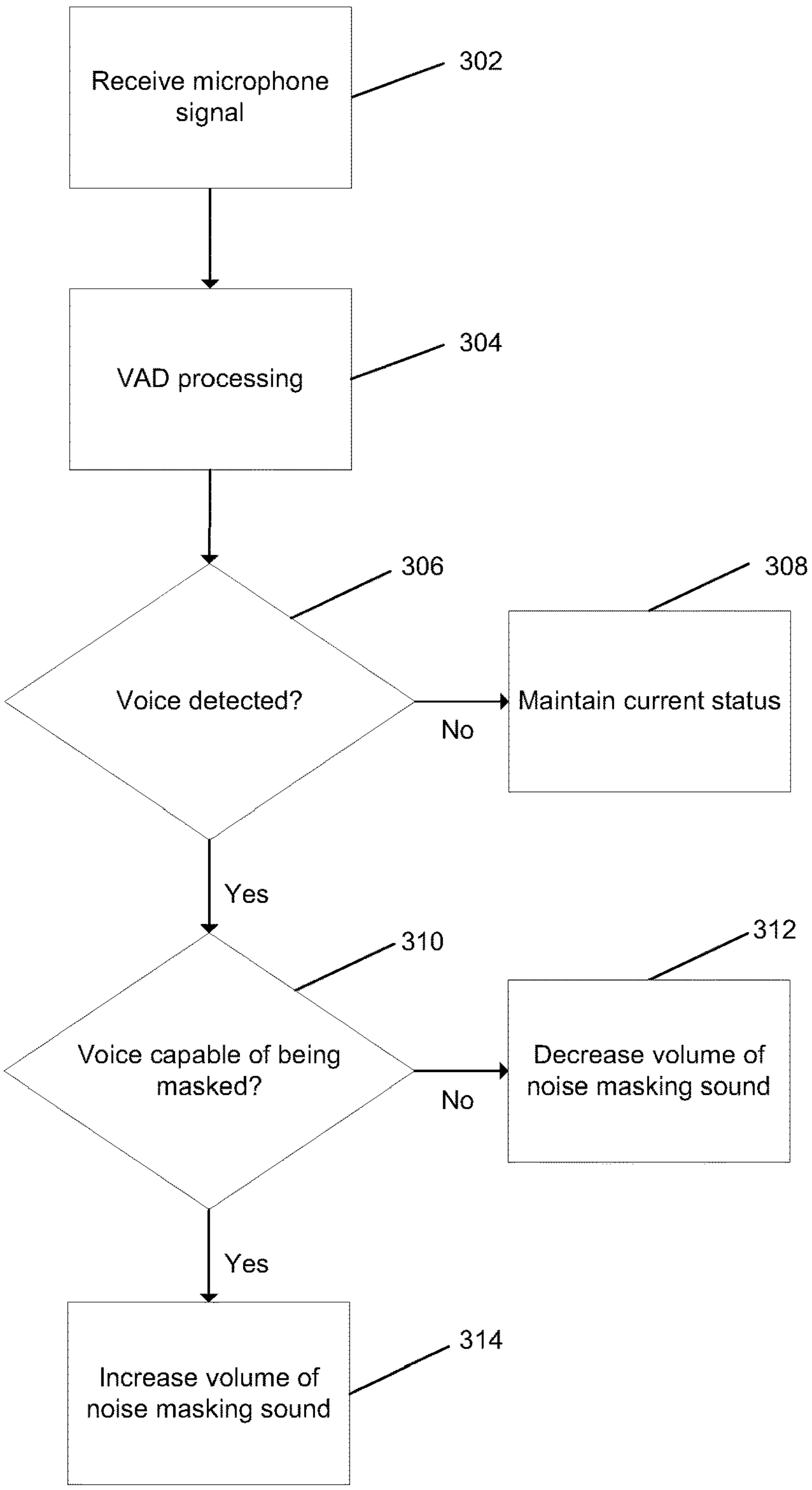
FIG. 3 is a flow diagram illustrating open space noise masking in one example.

FIG. 3 is a flow diagram illustrating open space noise masking in one example. In the example of FIG. 3, the noise source is one or more voices in the open space 100, such as that resulting from conversations, telephone calls, or video calls. At block 302, a microphone signal is received. At block 304, voice activity detection (VAD) processing is performed. At decision block 306, it is determined whether a voice has been detected in the microphone signal. If no at decision block 306, at block 308 the current status of the noise masking sound output is maintained.

If yes at decision block 306, at decision block 310, it is determined whether the detected voice is capable of being masked. If no at decision block 310, block 312 the volume of the noise masking sound is decreased. If yes at decision block 310, at block 314 the volume of the noise masking sound is increased.

Figure 4:
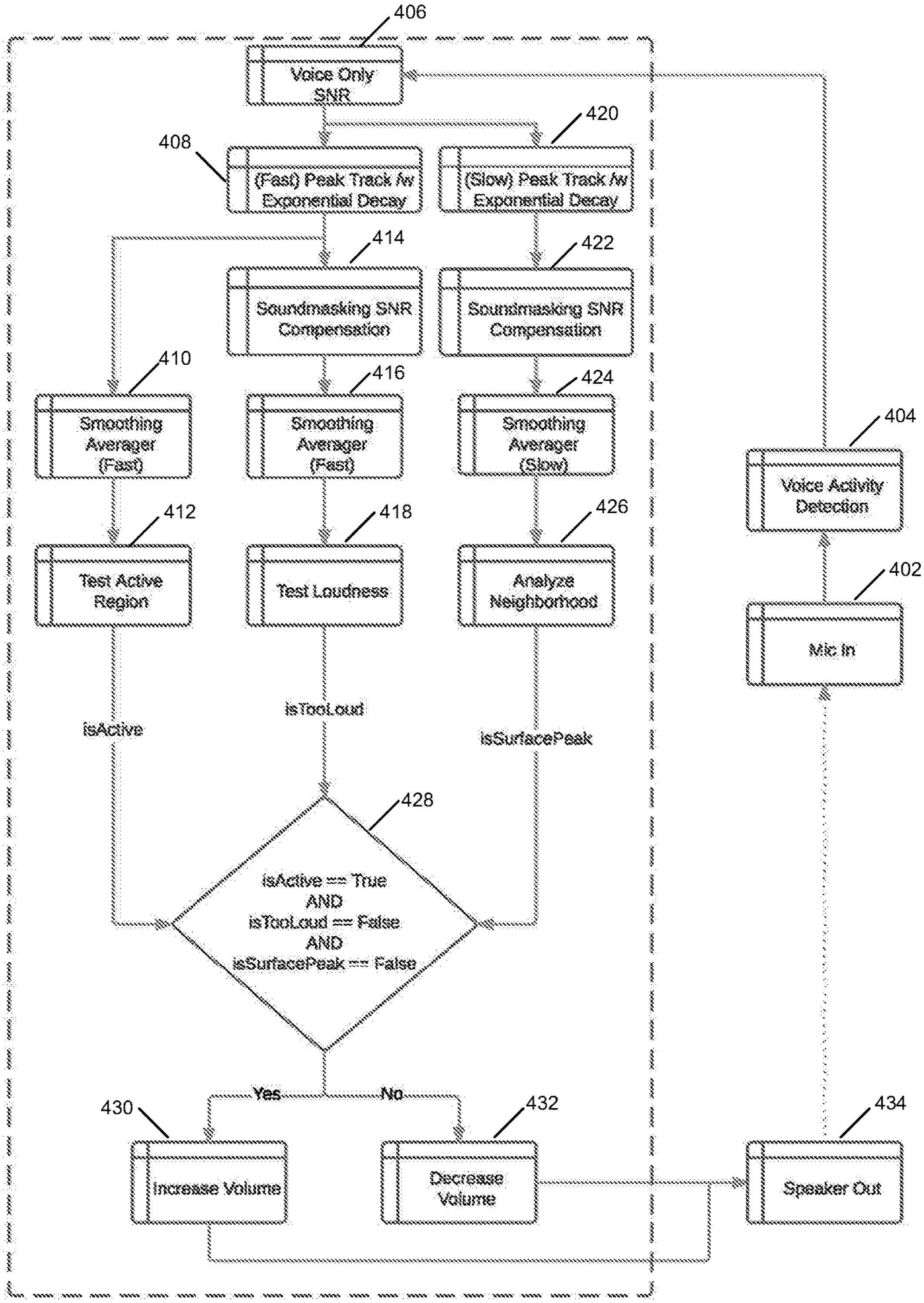
FIG. 4 is a flow diagram illustrating open space noise masking in a further example.

FIG. 4 is a flow diagram illustrating open space noise masking in a further example. As in FIG. 3, the noise source is one or more voices (also referred to herein as a "distractor") in the open space 100. A microphone output signal is provided to VAD block 404 from Microphone In block 402. VAD block 404 is optimized to detect distractor voice activity. The Voice Only SNR block 406 determines and outputs the SNR signal of the voice component of the microphone output signal.

The SNR signal is processed by three parallel paths to determine whether to increase the volume of the noise masking sound output or decrease the volume of the noise masking sound output in a given sub-unit 16. As used herein, the terms "Fast" and "Slow" correspond to how much history is analyzed when detecting peaks or signal smoothing, where "Fast" refers to a short history.

On the first path, (Fast) Peak Track with Exponential Decay block 408 tracks the peak level of the SNR signal (i.e., how loudly the distractor is speaking). Smoothing averager (Fast) block 410 removes instantaneous fluctuations from the SNR signal, such as those caused by pauses in the distractor speech. Test Active Region block 412 determines whether the SNR is within the SNR range indicating whether a person is talking (i.e., the "Active Region"). If yes, Test Active Region block 412 sets isActive=True. If no, Test Active Region block 412 sets isActive=False.

On the second path, (Fast) Peak Track with Exponential Decay block 408 tracks the peak level of the SNR signal. Sound masking SNR Compensation block 414 accounts for and measures how loudly someone is speaking in a region where sound masking is louder than its baseline volume. For example, output of noise masking sound from loudspeaker output block 434 is received at microphone in block 402. Smoothing averager (Fast) block 416 operates as described above. Test Loudness block 418 determines whether the SNR is too high to be masked. If yes (i.e., the SNR is too high to be masked), Test Loudness block 418 sets isTooLoud=True. If no (i.e., the SNR can be masked), Test Active Region block 412 sets isTooLoud=False. Thus, Test Loudness block 418 prevents a volume increase if the system detects it cannot do anything about the distractor voice. The isTooLoud indicator also serves as a partial indicator of distractor presence in a region.

On the third path, (Slow) Peak Track with Exponential Decay block 420 tracks the peak level of the SNR signal over a longer period of time. Sound masking SNR Compensation block 422 accounts for and measures how loudly someone is speaking in a region where sound masking is louder than its baseline volume. Smoothing averager (Slow) block 424 operates as described above. Analyze neighborhood block 426 identifies a region where someone may be a distractor, but is not necessarily speaking loudly enough to trigger isTooLoud. Utilizing results from neighboring regions, analyze neighborhood block 426 identifies the location of the distractor even if the distractor is not speaking loud enough to trigger isTooLoud=True. For example, such a situation may occur if the distractor is at an edge of a given sub-unit 16 far from the sub-unit microphone. If yes (i.e., a distractor is present), Analyze neighborhood block 426 sets isSurfacePeak=True. If no (i.e., a distractor is not present), Analyze neighborhood block 426 sets isSurfacePeak=False. Thus, Analyze neighborhood block 426 prevents a volume increase if the system detects someone may be a distractor, but is not necessarily speaking loudly enough to trigger isTooLoud. The isSurfacePeak indicator serves as a better indicator of distractor presence in a region than isTooLoud.

At decision block 428, the three paths converge. At decision block 428, it is determined whether isActive=True AND isTooLoud=False AND isSurfacePeak=False. If yes at decision block 428, at block 430 the volume of the noise masking sound is increased by an amount responsive to the peak level of the SNR signal. If no at decision block 428, at block 432 the volume of the noise masking sound is decreased responsive to the peak level of the SNR signal. The volume is increased or decreased at a rate slow enough so as to minimize distraction to people in the open space 100. In one example, the rate at which the volume level increases (the "ramp up") to achieve masking and the rate at which it decreases back to the baseline (the "ramp down") when the distraction is reduced or terminates are independently controlled. The ramp up is done as quickly as possible without being disruptive, which is set as a dB/sec parameter value. However, the ramp down is set to be much slower to ensure that the distracting speech has really ended as opposed reacting to natural pauses in speech. The volume of the noise masking sound is not decreased below a baseline value representing steady-state output when no distractors are present. At loudspeaker output block 434, the noise masking sound is output. In one example, the above process is repeated at each geographic sub-unit 16.

Figure 5:
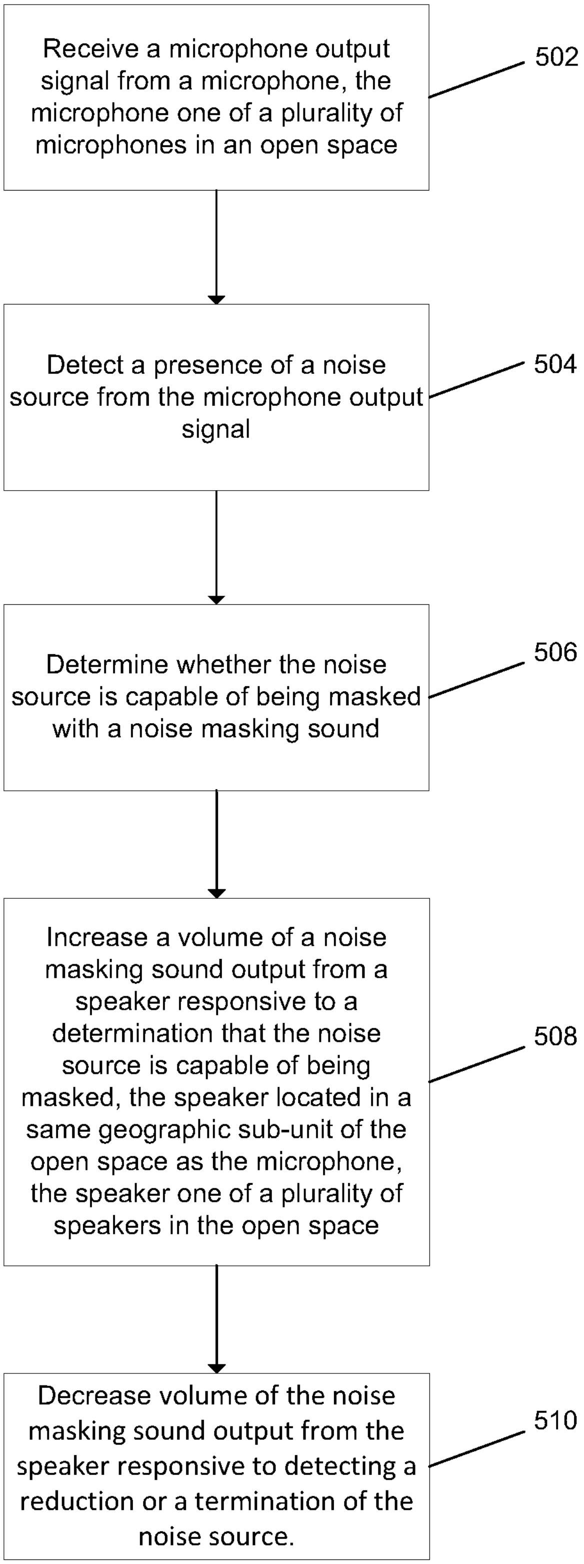
FIG. 5 is a flow diagram illustrating open space noise masking in a further example.

FIG. 5 is a flow diagram illustrating open space noise masking in a further example. At block 502, a microphone output signal from a microphone is received, the microphone one of a plurality of microphones in an open space. At block 504, a presence of a noise source is detected from the microphone output signal. In one example, detecting the presence of the noise source from the microphone output signal includes detecting a voice activity.

At block 506, it is determined whether the noise source is capable of being masked with a noise masking sound. In one example, determining whether the noise source is capable of being masked with the noise masking sound comprises determining a loudness level of the noise source and/or determining a signal-to-noise ratio from the microphone output signal. If it is determined that the noise source is not capable of being masked (e.g., because it is at too high of a volume level), the volume of the noise masking sound output from the loudspeaker is decreased or maintained.

At block 508, a volume of a noise masking sound output from a loudspeaker is increased responsive to a determination that the noise source is capable of being masked, the loudspeaker located in a same geographic sub-unit of the open space as the microphone, the loudspeaker one of a plurality of loudspeakers in the open space. In one example, the volume of the noise masking sound output from the loudspeaker is increased an amount responsive to a detected level of the noise source. At block 510, the volume of the noise masking sound output from the loudspeaker is decreased responsive to detecting a reduction or a termination of the noise source from the microphone output signal.

Figure 6:
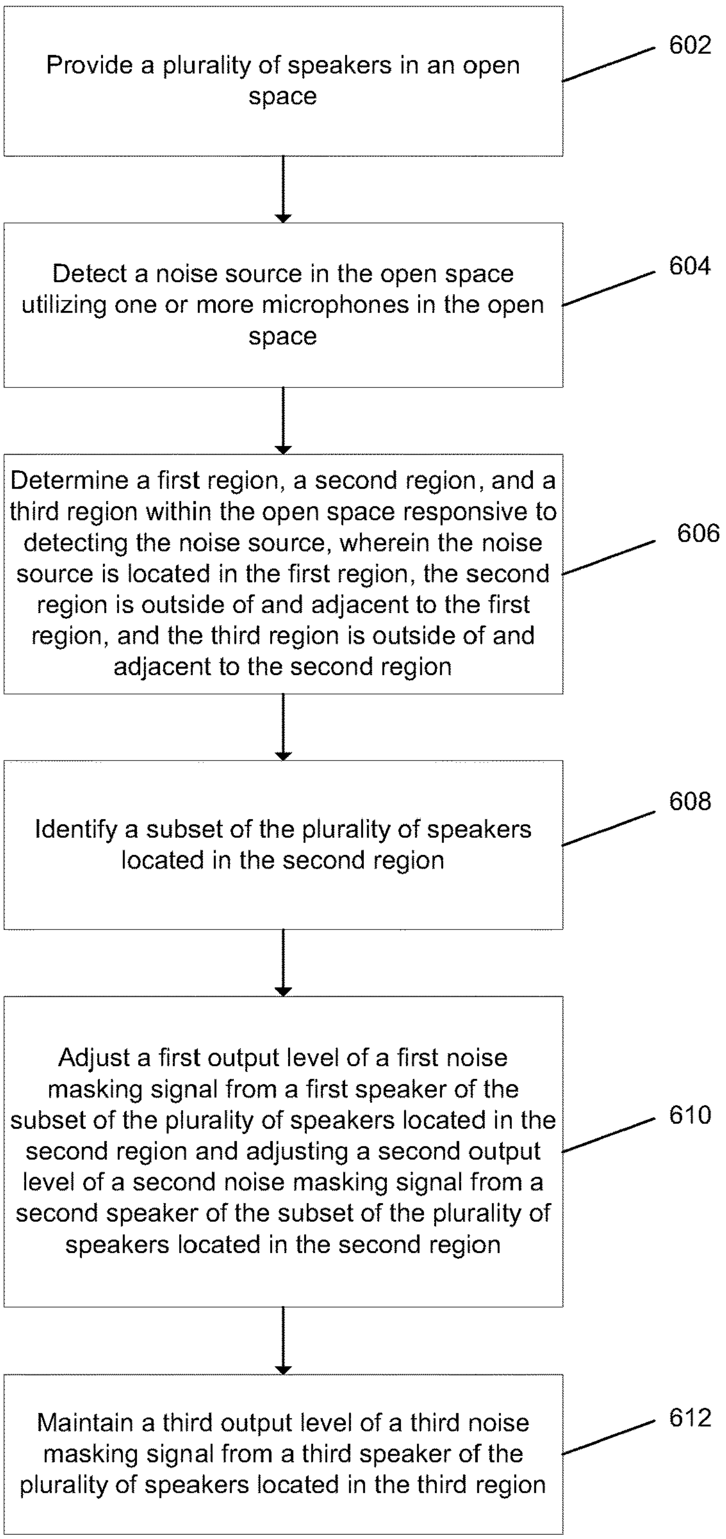
FIG. 6 is a flow diagram illustrating open space noise masking in a further example.

FIG. 6 is a flow diagram illustrating open space noise masking in a further example. At block 602, a plurality of loudspeakers in an open space is provided. At block 604, a noise source in the open space is detected utilizing one or more microphones in the open space. In one example, the noise source is speech and a voice activity detector is utilized to detect the speech.

At block 606, a first region, a second region, and a third region are determined within the open space responsive to detecting the noise source, wherein the noise source is located in the first region, the second region is outside of and adjacent to the first region, and the third region is outside of and adjacent to the second region. In one example, the output level of the loudspeakers located in the first region is maintained or reduced.

In one example, determining the second region comprises determining whether the noise source is capable of being masked with a noise masking sound. For example, a loudness level of the noise source is determined or a signal-to-noise ratio is determined. In a further example, the second region is determined based on the distance from the location of the noise source. At block 608, a subset of the plurality of loudspeakers is identified located in the second region.

At block 610, a first noise masking signal from a first loudspeaker of the subset of the plurality of loudspeakers located in the second region is adjusted and a second output level of a second noise masking signal from a second loudspeaker of the subset of the plurality of loudspeakers located in the second region is adjusted. In one example, the first output level is different from the second output level. At block 612, a third output level of a third noise masking signal from a third loudspeaker of the plurality of loudspeakers located in the third region is maintained.

Figure 7:
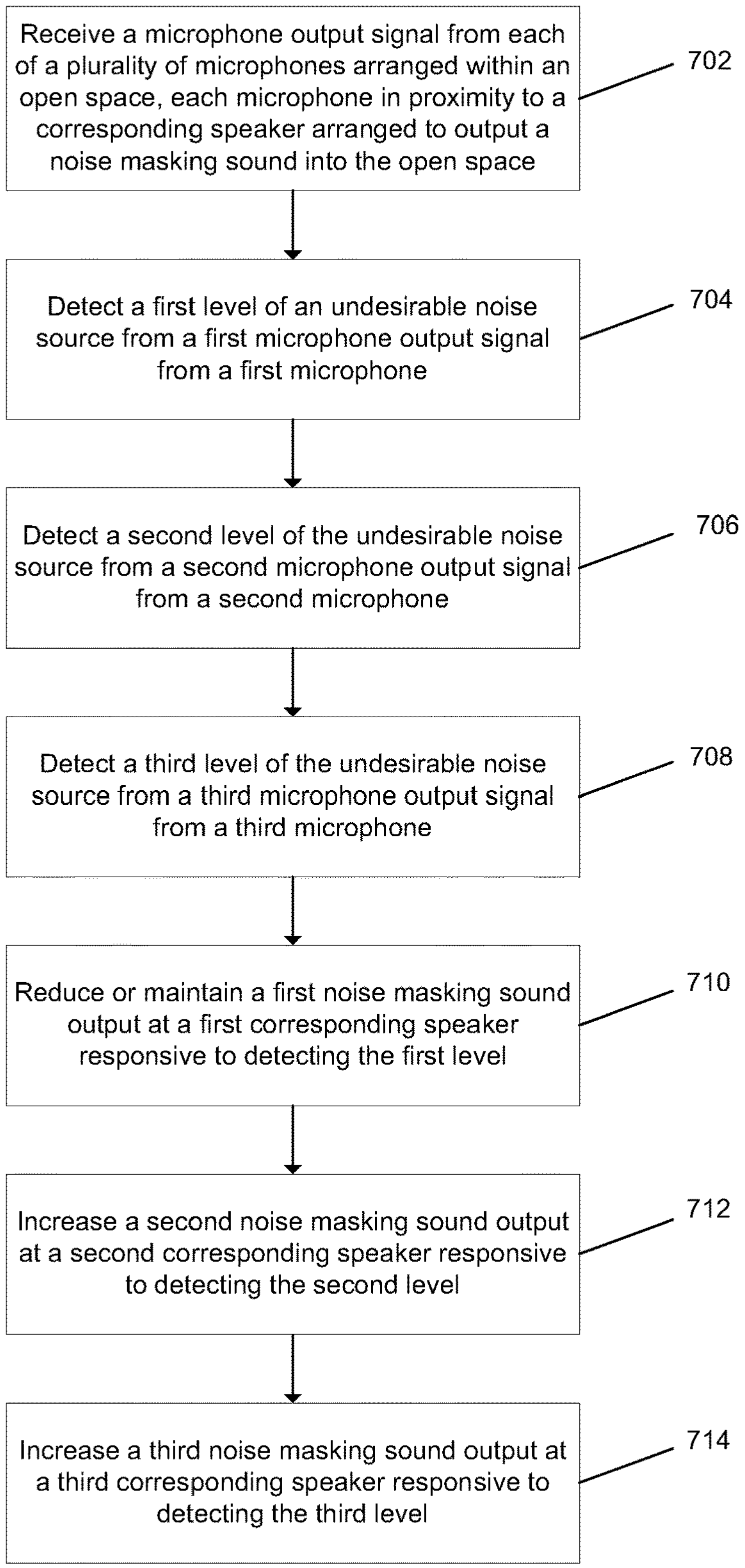
FIG. 7 is a flow diagram illustrating open space noise masking in a further example.

FIG. 7 is a flow diagram illustrating open space noise masking in a further example. At block 702, a microphone output signal is received from each of a plurality of microphones arranged within an open space, each microphone in proximity to a corresponding loudspeaker arranged to output a noise masking sound into the open space.

At block 704, a first level of an undesirable noise source is detected from a first microphone output signal from a first microphone. At block 706, a second level of the undesirable noise source is detected from a second microphone output signal from a second microphone. At block 708, a third level of the undesirable noise source is detected from a third microphone output signal from a third microphone.

At block 710, a first noise masking sound output at a first corresponding loudspeaker is reduced or maintained responsive to detecting the first level. At block 712, a second noise masking sound output at a second corresponding loudspeaker is increased responsive to detecting the second level. At block 714, a third noise masking sound output at a third corresponding loudspeaker is increased responsive to detecting the third level. In one example, the third microphone is located at a distance further from a location of the noise source than a location of the second microphone, and the third noise masking sound output is less than the second noise masking sound output.

In one example, the process further includes detecting the undesirable noise source is below a threshold level from a fourth microphone output signal from a fourth microphone. A fourth noise masking sound output at a fourth corresponding loudspeaker is maintained responsive detecting the undesirable noise source is below the threshold level.

FIG. 10 illustrates a system block diagram of a computing device 6 suitable for executing software application programs that implement the methods and processes described herein in one example. The architecture and configuration of the computing device 6 shown and described herein are merely illustrative and other computer system architectures and configurations may also be utilized.

The exemplary computing device 6 includes a display 1003, a keyboard 1009, and a mouse 1011, one or more drives to read a computer readable storage medium, a system memory 1053, and a hard drive 1055 which can be utilized to store and/or retrieve software programs incorporating computer codes that implement the methods and processes described herein and/or data for use with the software programs, for example. For example, the computer readable storage medium may be a CD readable by a corresponding CD-ROM or CD-RW drive 1013 or a flash memory readable by a corresponding flash memory drive. Computer readable medium typically refers to any data storage device that can store data readable by a computer system. Examples of computer readable storage media include magnetic media such as hard disks, floppy disks, and magnetic tape, optical media such as CD-ROM disks, magneto-optical media such as optical disks, and specially configured hardware devices such as application-specific integrated circuits (ASICs), programmable logic devices (PLDs), and ROM and RAM devices.

The computing device 6 includes various subsystems such as a microprocessor 1051 (also referred to as a CPU or central processing unit), system memory 1053, fixed storage 1055 (such as a hard drive), removable storage 1057 (such as a flash memory drive), display adapter 1059, sound card 1061, transducers 1063 (such as loudspeakers and microphones), network interface 1065, and/or printer/fax/scanner interface 1067. The computing device 6 also includes a system bus 1069. However, the specific buses shown are merely illustrative of any interconnection scheme serving to link the various subsystems. For example, a local bus can be utilized to connect the central processor to the system memory and display adapter. Methods and processes described herein may be executed solely upon CPU 1051 and/or may be performed across a network such as the Internet, intranet networks, or LANs (local area networks) in conjunction with a remote CPU that shares a portion of the processing.

While the exemplary embodiments of the present invention are described and illustrated herein, it will be appreciated that they are merely illustrative and that modifications can be made to these embodiments without departing from the spirit and scope of the invention. Acts described herein may be computer readable and executable instructions that can be implemented by one or more processors and stored on a computer readable memory or articles. The computer readable and executable instructions may include, for example, application programs, program modules, routines and subroutines, a thread of execution, and the like. In some instances, not all acts may be required to be implemented in a methodology described herein.

Terms such as "component", "module", and "system" are intended to encompass software, hardware, or a combination of software and hardware. For example, a system or component may be a process, a process executing on a processor, or a processor. Furthermore, a functionality, component or system may be localized on a single device or distributed across several devices. The described subject matter may be implemented as an apparatus, a method, or article of manufacture using standard programming or engineering techniques to produce software, firmware, hardware, or any combination thereof to control one or more computing devices.

Thus, the scope of the invention is intended to be defined only in terms of the following claims as may be amended, with each claim being expressly incorporated into this Description of Specific Embodiments as an embodiment of the invention.

What is claimed is:

1. A method comprising:

receiving a microphone output signal from a microphone, the microphone one of a plurality of microphones in an open space;

detecting a presence of a noise source from the microphone output signal;

determining whether the noise source is capable of being masked with a noise masking sound, wherein determining whether the noise source is capable of being masked with the noise masking sound comprises determining a signal-to-noise ratio from the microphone output signal or determining a loudness level of the noise source; and increasing a volume of a noise masking sound output from a loudspeaker responsive to a determination that the noise source is capable of being masked, the loudspeaker located in a same geographic sub-unit of the open space as the microphone, the loudspeaker one of a plurality of loudspeakers in the open space.

2. The method of claim 1, further comprising decreasing the volume of the noise masking sound output from the loudspeaker responsive to detecting a reduction or a termination of the noise source from the microphone output signal.

3. The method of claim 1, further comprising decreasing the volume of the noise masking sound output from the loudspeaker responsive to a determination that the noise source is not capable of being masked.

4. The method of claim 1, further comprising maintaining the volume of the noise masking sound output from the loudspeaker responsive to a determination that the noise source is not capable of being masked.

5. The method of claim 1, wherein the volume of the noise masking sound output from the loudspeaker is increased an amount responsive to a detected level of the noise source.

6. The method of claim 1, wherein detecting the presence of the noise source from the microphone output signal comprises detecting a voice activity.

7. A system comprising:

a plurality of microphones to be disposed in an open space;

a plurality of loudspeakers to be disposed in the open space; and a computing device comprising:

a communications interface configured to receive a plurality of microphone output signals from the plurality of microphones and configured to transmit noise masking signals for output at the plurality of loudspeakers;

a processor; and a memory storing an application program comprising instructions executable by the processor to perform operations comprising:

receiving a microphone output signal from a microphone, the microphone one of the plurality of microphones;

detecting a presence of a noise source from the microphone output signal;

determining whether the noise source is capable of being masked with a noise masking sound, wherein determining whether the noise source is capable of being masked with the noise masking sound comprises determining a signal-to-noise ratio from the microphone output signal or determining a loudness level of the noise source; and increasing an output level of a noise masking signal at a loudspeaker responsive to a determination that the noise source is capable of being masked, the loudspeaker located in a same geographic sub-unit of the open space as the microphone, the loudspeaker one of the plurality of loudspeakers.

8. The system of claim 7, wherein the operations further comprise:

receiving a second microphone output signal from a second microphone, the second microphone one of the plurality of microphones;

detecting a presence of the noise source from the second microphone output signal;

determining whether the noise source is capable of being masked with a second noise masking sound; and increasing an output level of a second noise masking signal at a second loudspeaker responsive to a determination that the noise source is capable of being masked, the second loudspeaker located in a same geographic sub-unit of an open space as the second microphone, the second loudspeaker one of the plurality of loudspeakers.

9. The system of claim 8, wherein the second noise masking signal is output at a different level than the noise masking signal.

10. The system of claim 7, further comprising decreasing the volume of the noise masking sound output from the loudspeaker responsive to a determination that the noise source is not capable of being masked.

11. The system of claim 7, further comprising maintaining the volume of the noise masking sound output from the loudspeaker responsive to a determination that the noise source is not capable of being masked.

12. The system of claim 7, wherein the volume of the noise masking sound output from the loudspeaker is increased an amount responsive to a detected level of the noise source.

13. The system of claim 7, wherein detecting the presence of the noise source from the microphone output signal comprises detecting a voice activity.

14. A method comprising:

providing a plurality of loudspeakers in an open space;

detecting a noise source in the open space utilizing one or more microphones in the open space;

determining a first region, a second region, and a third region within the open space responsive to detecting the noise source, wherein the noise source is located in the first region, the second region is outside of and adjacent to the first region, and the third region is outside of and adjacent to the second region;

identifying a subset of the plurality of loudspeakers located in the second region;

adjusting a first output level of a first noise masking signal from a first loudspeaker of the subset of the plurality of loudspeakers located in the second region and adjusting a second output level of a second noise masking signal from a second loudspeaker of the subset of the plurality of loudspeakers located in the second region, the first output level different from the second output level; and maintaining a third output level of a third noise masking signal from a third loudspeaker of the plurality of loudspeakers located in the third region.

15. The method of claim 14, further comprising maintaining a fourth output level of a fourth noise masking signal from a fourth loudspeaker of the plurality of loudspeakers located in the first region.

16. The method of claim 14, further comprising reducing a fourth output level of a fourth noise masking signal from a fourth loudspeaker of the plurality of loudspeakers located in the first region.

17. The method of claim 14, wherein determining the second region comprises determining whether the noise source is capable of being masked with a noise masking sound.

18. The method of claim 17, wherein determining whether the noise source is capable of being masked with the noise masking sound comprises determining a signal-to-noise ratio from a signal output from a microphone disposed in the second region.

19. The method of claim 17, wherein determining whether the noise source is capable of being masked with the noise masking sound comprises determining a loudness level of the noise source.

20. The method of claim 14, wherein detecting the noise source in the open space utilizing one or more microphones in the open space comprises detecting a voice activity.

21. A method comprising:

receiving a microphone output signal from each of a plurality of microphones arranged within an open space, each microphone in proximity to a corresponding loudspeaker arranged to output a noise masking sound into the open space;

detecting a first level of an undesirable noise source from a first microphone output signal from a first microphone, a second level of the undesirable noise source from a second microphone output signal from a second microphone, and a third level of the undesirable noise source from a third microphone output signal from a third microphone; and reducing or maintaining a first noise masking sound output at a first corresponding loudspeaker responsive to detecting the first level, increasing a second noise masking sound output at a second corresponding loudspeaker responsive to detecting the second level, and increasing a third noise masking sound output at a third corresponding loudspeaker responsive to detecting the third level.

22. The method of claim 21, further comprising:

detecting the undesirable noise source is below a threshold level from a fourth microphone output signal from a fourth microphone; and maintaining a fourth noise masking sound output at a fourth corresponding loudspeaker responsive detecting the undesirable noise source is below the threshold level.

23. The method of claim 21, wherein the third microphone is located at a distance further from a location of the noise source than a location of the second microphone, and the third noise masking sound output is less than the second noise masking sound output.

* * * * *